(12) United States Patent
Kojima (10) Patent No.: US 7,728,386 B2
(45) Date of Patent: Jun. 1, 2010

(54) SEMICONDUCTOR INTEGRATED CIRCUIT DEVICE

(75) Inventor: Makoto Kojima, Suita (JP)

(73) Assignee: Panasonic Corporation, Osaka (JP)

( * ) Notice: Subject to any disclaimer, the term of this patent is extended or adjusted under 35 U.S.C. 154(b) by 1208 days.

(21) Appl. No.: 11/270,598

(22) Filed: Nov. 10, 2005

(65) Prior Publication Data

US 2006/0113606 A1 Jun. 1, 2006

(30) Foreign Application Priority Data

Nov. 10, 2004 (JP) ............................ P2004-326538

(51) Int. Cl.
*H01L 29/94* (2006.01)
(52) U.S. Cl. .............................. 257/369; 257/E27.064; 257/E27.062; 438/199; 326/81; 326/68
(58) Field of Classification Search ................. 257/369, 257/E27.064, E27.062; 438/199; 326/63, 326/68, 80–83
See application file for complete search history.

(56) References Cited

U.S. PATENT DOCUMENTS 5,465,054 A 11/1995 Erhart 6,229,382 B1 * 5/2001 Kojima ........................ 327/538

FOREIGN PATENT DOCUMENTS

JP 3190915 B2 5/2001

OTHER PUBLICATIONS

Plummer, Silicon VLSI Technology Fundamentals, Practice and Modeling, 2000, Prentice Hall, p. 17.*

* cited by examiner

*Primary Examiner*—Kiesha R Bryant
*Assistant Examiner*—Tucker Wright
(74) *Attorney, Agent, or Firm*—McDermott Will & Emery LLP (57) ABSTRACT

The invention provides a CMOS integrated circuit capable of carrying out an operation at a comparatively high supply voltage, comprising a first MOS type transistor having a drain profile to come in contact with a gate through a low concentration region having an impurity concentration which is equal to or lower than a predetermined concentration at a drain end, and a second MOS type transistor and transfer gate having the same polarity which is connected to a gate of the first MOS type transistor, wherein a gate voltage is applied to the gate of the first MOS type transistor through the second MOS type transistor and transfer gate to which a predetermined potential (a shielding voltage) is applied.

19 Claims, 7 Drawing Sheets

SEMICONDUCTOR INTEGRATED CIRCUIT DEVICE

BACKGROUND OF THE INVENTION

1. Field of the Invention

The present invention relates to a semiconductor integrated circuit device and a manufacturing method thereof, and more particularly to a semiconductor integrated circuit device for constituting a CMOS logic circuit capable of driving a high voltage without an additional thick oxide film step in a CMOS unit manufacturing process by using a transistor of a low voltage type.

2. Description of the Related Art

The microfabrication of a semiconductor integrated circuit device using a CMOS transistor has been advanced and the degree of integration has been increased more and more. With the microfabrication, the supply voltage of the semiconductor integrated circuit device is dropped in accordance with the scaling rule. For example, in a 0.18 μm process, the standard working voltage of a standard MOS transistor is standard 1.8V, and a MOS transistor having a gate oxide film thickness of approximately 4 nm is used. Most of units to be used in the semiconductor integrated circuit device in the 0.18 μm process are semiconductor devices using a circuit utilizing a MOS transistor having a 1.8V specification and having the degree of integration increased. In a whole system, a semiconductor integrated circuit device having a 3.3V specification created in a former process is mixed or the driving voltage of a motor or an LCD cannot be dropped in some components. In a connection to the components, a breakdown voltage cannot be obtained in the transistor having the 1.8V specification. For this reason, it is necessary to further prepare, as a separate process, a MOS transistor having a high voltage specification for driving a high voltage.

The following needs the care. In the case in which a voltage system transistor of a new type is to be introduced, it is necessary to introduce a transistor having a film thickness corresponding to the voltage system. For example, in the 0.18 μm process, there is provided a transistor having a 3.3V specification in the thickness of the gate oxide film of approximately 8 nm which drives 3.3 V of the semiconductor integrated circuit device (0.35 μm process) created in the former process described above. The 8 nm gate oxide film is generally formed by a method referred to as a double oxidation and the whole Si surface of a portion in which the transistor is formed is once oxidized at a gate oxide film forming step to form an oxide film having a certain thickness, and only the oxide film in the portion in which a transistor having a 1.8 V specification is formed is etched, and thereafter, the whole surface is further oxidized, which will not be described in detail. Therefore, the oxide film of the transistor having the 3.3 V specification is formed by the oxidation carried out twice which puts an etching step therebetween. In the case in which a high voltage transistor of another type is further required, a triple gate oxide film is formed.

There is the following problem. More specifically, the double and triple gate oxide films have variations in thicknesses increased. In addition, in a transistor having a kind of thinnest oxide film, the etching step is carried out so that an increase in a diffusion length is caused by a variation in a channel concentration and an impurity diffusion due to a heating step of forming an oxide film and it is hard to form and control a transistor having a very small dimension.

In other words, it is difficult to carelessly increase the type of a transistor having a working voltage corresponding to a voltage to be used. Due to this restriction, a voltage which can be used in the semiconductor integrated circuit device is limited. For such a problem, there has been proposed a semiconductor integrated circuit device using a CMOS transistor handling a signal having a higher supply voltage by utilizing a transistor of a low voltage type (for example, see U.S. Pat. No. 5,465,054 and Japanese Patent No. 3190915).

Figure 8:
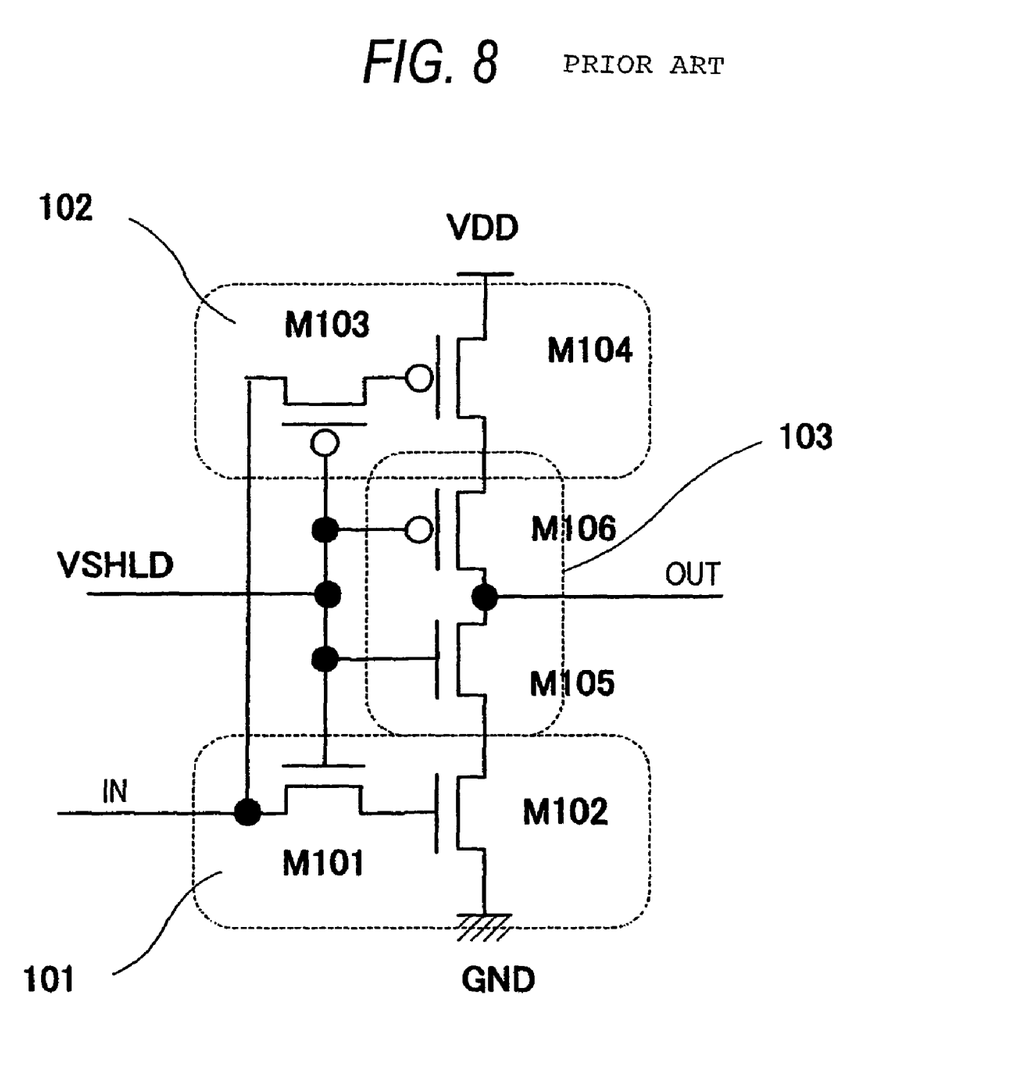
FIG. 8 is an explanatory diagram showing the structure of a MOS capacitive type semiconductor device according to a conventional example.

FIG. 8 shows a semiconductor integrated circuit device using a CMOS transistor handling a signal having a higher supply voltage by utilizing a transistor of a low voltage type. An input signal IN is given to the gate of an N-type transistor M102 connected to GND through an N-type transistor and transfer gate M101 having a gate to which a shielding voltage VSHLD is applied, while the input signal IN is given to the gate of a P-type transistor M104 connected to a power supply VDD through a P-type transistor and transfer gate M103 having a gate to which the shielding voltage VSHLD is applied, and the drains of the N- and P-type transistors M102 and M104 are connected to an output terminal OUT through transfer gates M105 and M106 having gates to which the shielding voltage VSHLD is applied, respectively.

The composite unit logically serves as a CMOS inverter and has an allowable voltage which is approximately a double of that of each unit.

(1) Referring to the Breakdown Voltage of a Gate Oxide Film

In case of the N-type transistor M102 to be the main component of a CMOS inverter, a voltage which is equal to or higher than a voltage of the shielding voltage VSHLD–threshold voltage Vtn which is the gate voltage of the N-type transistor and transfer gate M101 connected to a gate thereof is not applied, and a voltage which is equal to or higher than the former voltage (the shielding voltage VSHLD–threshold voltage Vtn) is not applied even if a supply voltage VDD having a logical level in a circuit with a VDD system power supply is applied. When the shielding voltage VSHLD is set to be approximately VDD/2, moreover, only a voltage which is equal to or lower than the breakdown voltage of the N-type transistor is applied to the gate of the N-type transistor M102 even if a double of the breakdown voltage is applied as the supply voltage VDD. Referring to the N-type transistor and transfer gate M101, furthermore, a voltage of VDD/2 is applied to the gate itself. Even if a signal having an amplitude on supply voltage VDD and GND levels is input to the input terminal IN, therefore, only a half of the supply voltage is applied as a stress to a gate oxide film. Referring to the P-type transistors M104 and M103, similarly, only a half of the supply voltage is applied as the stress. Also in a general system having a supply voltage which is a double of a breakdown voltage, therefore, a composite unit having such a structure can satisfy the breakdown voltage of the gate oxide film and a deterioration in the reliability of the gate oxide film can be avoided.

In addition, the argument about the breakdown voltage of the gate oxide film applies to all transistors including the drain voltage limiting transistors M105 and M106.

(2) A Drain-Source Breakdown Voltage (a Channel Breakdown Voltage)

The N-type transistor M102 to be the main component of the CMOS inverter has a source connected to the GND and a drain connected to the output terminal OUT for outputting a voltage of the supply voltage VDD-GND through the N-type transfer gate transistor M105 having the gate to which the shielding voltage VSHLD is input. The drain voltage of the N-type transistor M102 has an upper limit voltage which is limited by the N-type transfer gate M105 and is lower than the shielding voltage VSHLD-threshold voltage Vtn, and the shielding voltage VSHLD is a half of the supply voltage VDD. For this reason, a voltage to be applied to the drain of the N-type transistor M102 can be prevented from exceeding the half of the supply voltage VDD. Even if a double of the N-type transistor breakdown voltage is applied as the supply voltage VDD in the same manner as in the argument, therefore, only a voltage which is equal to or lower than the breakdown voltage is applied as the drain-source voltage of the N-type transistor M102. Referring to other N-type transistors (the two N-type transfer gates M101 and M105), consequently, it is possible to maintain the drain-source voltage to be equal to or lower than the breakdown voltage by properly holding the transition speed of the input signal IN and the size of a device. Furthermore, this applies to the P-type transistors M104, M103 and M106.

Although it is possible to drive a high voltage by using a transistor of a low voltage type in the technique as described above, there are the following problems.

(1) A transfer gate transistor for an increase in a voltage is added to a current path for driving an output and they are connected in series. For this reason, an extra transistor arrangement is required. Consequently, the size of a driver is increased by double causes.

(2) When the supply voltage VDD is set to be equal to or higher than a double of the breakdown voltage of each unit, a voltage to be applied to each unit is equal to or higher than the breakdown voltage. With the conventional structure, therefore, the supply voltage VDD cannot be increased to be a double of the breakdown voltage of the unit or more.

SUMMARY OF THE INVENTION

In consideration of the actual circumstances, it is an object of the invention to provide a semiconductor integrated circuit which maintains a working voltage range and can prevent an increase in a layout area in a circuit structure capable of driving a high voltage by using a transistor of a low voltage type.

More specifically, it is an object of the invention to provide a semiconductor integrated circuit comprising a transistor circuit capable of implementing an increase in a breakdown voltage at the drain end of a transistor unit without changing the thickness of an oxide film.

The invention provides a CMOS integrated circuit capable of carrying out an operation at a comparatively high supply voltage, comprising a first MOS type transistor having a drain profile to come in contact with a gate through a low concentration region having an impurity concentration which is equal to or lower than a predetermined concentration at a drain end, and a second MOS type transistor and transfer gate having the same polarity which is connected to a gate of the first MOS type transistor, wherein a gate voltage is applied to the gate of the first MOS type transistor through the second MOS type transistor and transfer gate to which a predetermined potential (a shielding voltage) is applied.

In the invention, moreover, the second MOS type transistor has a drain profile to come in contact with a gate through a low concentration region having an impurity concentration which is equal to or lower than a predetermined concentration at a drain end.

In the invention, furthermore, the second MOS type transistor has an impurity profile to come in contact with a gate through a low concentration region having an impurity concentration which is equal to or lower than a predetermined concentration at both a drain end (a signal input end) and a source end.

In the invention, moreover, the first MOS type transistor has a drain profile to come in contact with a gate through a low concentration region having an impurity concentration which is equal to or lower than a predetermined concentration at both a drain end and a source end.

In the invention, furthermore, the predetermined concentration is equal to or lower than $5E18$ $cm^{-3}$.

In the invention, moreover, the low concentration region has a length of 0.05 µm or more.

In the invention, furthermore, the low concentration region is formed to maintain a predetermined dimension by using a photomask formed to cause a high concentration region acting as the drain to have an offset with respect to the gate, and the high concentration region is formed with an offset with respect to the gate.

In the invention, moreover, the low concentration region has a region formed to maintain a predetermined dimension by using a sidewall spacer and in which an implantation is carried out with an offset with respect to the gate.

In the invention, furthermore, the low concentration region is a second well having a reverse conductivity type which is provided adjacently to a first well having a certain conductivity type which constitutes a channel.

In the invention, moreover, the first well and the second well are formed in a deep well.

In the invention, furthermore, there are provided a composite type MOS semiconductor unit which has a drain profile to come in contact with the gate through a low concentration region having a predetermined length or more and a predetermined concentration or less at the drain end of the first MOS type transistor and in which a gate voltage is applied to the gate of the first MOS type transistor through the second MOS type transistor and transfer gate having the same polarity to which a first predetermined potential (a first shielding voltage) is applied, the first and second MOS type transistors having an N type and the source of the first MOS type transistor being connected to a first power supply, and a composite type MOS semiconductor unit which has a drain profile to come in contact with the gate through a low concentration region having a predetermined length or more and a predetermined concentration or less at a drain end of a third MOS type transistor and in which a common gate voltage to the first MOS type transistor is applied to a gate of the third MOS type transistor through a fourth MOS type transistor and transfer gate having the same polarity to which a second predetermined potential (a second shielding voltage) is applied, the third and fourth MOS type transistors having a P type and a source of the third MOS type transistor being connected to a second power supply.

In the invention, moreover, there are provided a composite type MOS semiconductor unit which has a drain profile to come in contact with the gate through a low concentration region having a predetermined length or more and a predetermined concentration or less at the drain end of the first MOS type transistor and in which a gate voltage is applied to the gate of the first MOS type transistor through the second MOS type transistor and transfer gate having the same polarity to which a first predetermined potential (a first shielding voltage) is applied, and which has a drain profile to come in contact with the gate through a low concentration region having a predetermined length or more and a predetermined concentration or less at the drain end (the signal input end) of the second MOS type transistor and transfer gate, the first and second MOS type transistors having an N type and the source of the first MOS type transistor being connected to a first power supply, and furthermore, a composite type MOS semiconductor unit which has a drain profile to come in contact with the gate through a low concentration region having a predetermined length or more and a predetermined concentration or less at a drain end of a third MOS type transistor and in which a common gate voltage to the first MOS type transistor is applied to a gate of the third MOS type transistor through a fourth MOS type transistor and transfer gate having the same polarity to which a second predetermined potential (a second shielding voltage) is applied, and which has a drain profile to come in contact with the gate through a low concentration region having a predetermined length or more and a predetermined concentration or less at a drain end (a signal input end) of the fourth MOS type transistor and transfer gate, the third and fourth MOS type transistors having a P type and a source of the third MOS type transistor being connected to a second power supply.

In the invention, furthermore, a plurality of composite type MOS semiconductor units of Nch is connected in series from a first power supply side, an output terminal is connected and a first shielding voltage is input in common, and the composite type MOS semiconductor unit of Pch is connected in parallel with a second power supply from the output terminal, a second shielding voltage is input in common, and an input of the composite type MOS semiconductor unit of each of the Pch and the Nch has an input terminal in each of the Pch and the Nch making a pair.

In the invention, moreover, a plurality of composite type MOS semiconductor units of Pch is connected in series from a second power supply side, an output terminal is connected and a second shielding voltage is input in common, and the composite type MOS semiconductor unit of Nch is connected in parallel with a first power supply from the output terminal, a first shielding voltage is input in common, and an input of the composite type MOS semiconductor unit of each of the Pch and the Nch has an input terminal in each of the Pch and the Nch making a pair.

In the invention, furthermore, each of the drain and the source of the first transistor of the composite type MOS semiconductor unit of Nch is connected to each of the drain and the source of the first transistor of the composite type MOS semiconductor unit of Pch, and a shielding voltage of the composite type MOS semiconductor unit of the Nch is a first shielding voltage and a shielding voltage of the composite type MOS semiconductor unit of the Pch is a second shielding voltage.

In the invention, moreover, the first predetermined potential (the first shielding voltage) is equal to the second predetermined potential (the second shielding voltage).

In the invention, furthermore, the CMOS integrated circuit transistor structure includes both a transistor structure belonging to the composite type MOS semiconductor unit and a transistor structure which does not belong to the composite type MOS semiconductor unit.

According to the invention, it is possible to implement an increase in a breakdown voltage at the drain end of a transistor unit without changing the thickness of an oxide film and it is not necessary to provide an extra transfer gate on a signal path for fetching an output signal, and it is possible to eliminate a transfer gate transistor (a drain voltage limiting transistor) in an output current path. Therefore, the size of a device can be decreased and a layout area can be reduced. Furthermore, the increase in the breakdown voltage eases the restrictions of a drain voltage for a gate (the breakdown voltage of the oxide film). Consequently, usual restrictions in which the breakdown voltage is equal to or lower than a double of the unit breakdown voltage of the supply voltage VDD can be changed to the improved restrictions in which the breakdown voltage is equal to or lower than the drain breakdown voltage. Thus, it is possible to further enlarge the range of a working voltage.

DESCRIPTION OF THE PREFERRED EMBODIMENTS

Next, embodiments of the invention will be described in detail with reference to the drawings.

Figure 1:
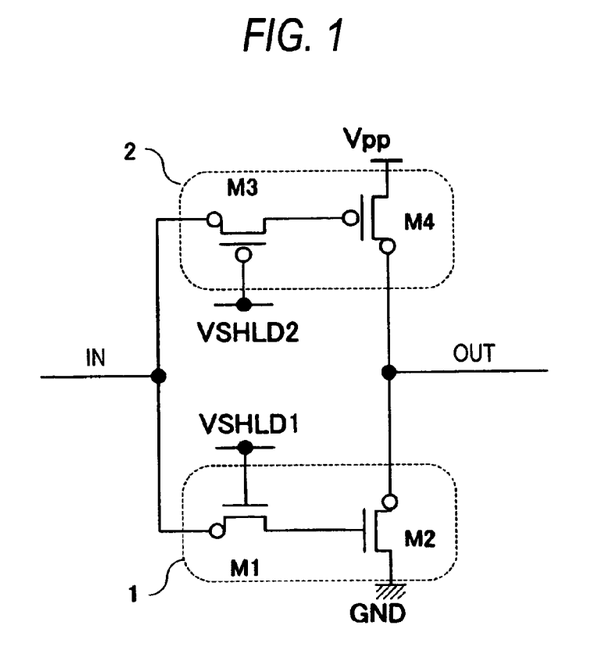
FIG. 1 is an equivalent circuit diagram showing an inverter obtained by the combination of composite transistors according to a first embodiment of the invention.

FIG. 1 shows an inverter circuit according to a first embodiment of the invention. The inverter circuit comprises an Nch switching transistor M2 to be a first MOS type transistor having a drain profile to come in contact with a gate through a low concentration region having an impurity concentration which is equal to or lower than a predetermined concentration corresponding to a supply voltage on a drain end, and a gate voltage limiting Nch transistor M1 to be a second MOS type transistor having the same polarity on the gate of the first MOS type transistor M2, and is constituted to apply a gate voltage to the gate of a first MOS type transistor and transfer gate through a second MOS type transistor and transfer gate to which a shielding voltage is applied. In the drawing, represents a terminal having the high breakdown voltage structure of source and drain terminals.

The inverter circuit has such a structure that a high voltage composite transistor 1 constituted by an Nch transistor composite unit and a high voltage composite transistor 2 constituted by a Pch transistor composite unit are connected in parallel.

The high voltage composite transistor 1 of the inverter circuit is constituted by the gate voltage limiting Nch transistor M1 comprising an Nch switching transistor and the high breakdown voltage transistor M2 comprising an Nch switching transistor which include drains having high breakdown voltage structures, respectively. The high breakdown voltage Nch transistor M2 to be a switching transistor having a high breakdown voltage structure on a drain has the drain connected to an OUT output terminal and a source connected to GND. On the other hand, an input IN is connected to the gate of the high breakdown voltage transistor M2 through the gate voltage limiting transistor M1 to which a first shielding voltage VSHLD1 is applied (the transistor having the high breakdown voltage structure on the drain).

Referring to a power supply Vpp side, moreover, a plurality of Pch transistors is connected in the same manner.

A high breakdown voltage Pch transistor M4 comprising a Pch switching transistor having a high breakdown voltage structure on a drain has the drain connected to the OUT output terminal and a source connected to the power supply Vpp. The input IN is connected to the gate through a gate voltage limiting Pch transistor M3 gated with a second shielding voltage VSHLD2 (a transistor having a high breakdown voltage structure on a drain).

Figure 2:
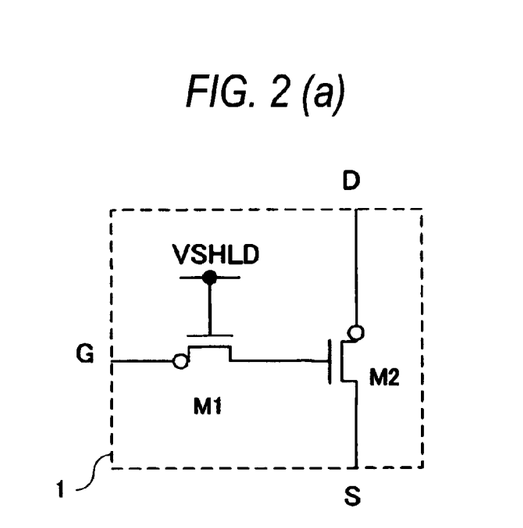
FIG. 2 is an equivalent circuit diagram showing the composite transistors according to the first embodiment of the invention, (a) being an equivalent circuit diagram showing an Nch composite transistor and (b) being an equivalent circuit diagram showing a Pch composite transistor.

FIG. 2(a) shows the Nch transistor composite unit constituted by the transistors M1 and M2 which is extracted and FIG. 2(b) shows the Pch transistor composite unit constituted by the transistors M3 and M4 which is extracted, and detailed description will be given with reference to these drawings.

FIG. 2(a) shows the high voltage composite transistor 1 constituted by an Nch transistor composite unit according to the invention. The gate of the transistor M2 is connected to a composite transistor gate terminal G through the gate voltage limiting Nch transistor M1 gated with the shielding voltage VSHLD (the transistor having the high breakdown voltage structure on the drain). In the case in which a higher voltage which can be usually applied to the device is applied to the composite transistor gate terminal G, a limitation to the shielding voltage VSHLD−threshold voltage Vth is carried out in consideration of a voltage to be applied to the gate of the transistor M2. Consequently, the shielding voltage VSHLD is regulated. Thus, it is possible to control the gate voltage of the transistor M2 within the normal applied voltage of the device so that an operation range having no problem of a reliability is obtained (At this time, the lowest voltage of the composite transistor 1 is set to have the ground level GND).

On the other hand, the drain end of the gate voltage limiting transistor M1 has the high breakdown voltage structure.

In general, the drain profile of a high voltage structure 1) has been introduced for relieving an electric field in an S-D direction on the drain end and decreasing the hot degree of carriers to reduce a carrier injection into a gate oxide film, and 2) has been introduced for relieving an electric field on an end in the diffusion region of the drain (an end with a gate, that is, a portion coming in contact with the channel stopper of a LOCOS edge portion in a conventional LOCOS process) to raise a breakdown voltage. In the following argument, a low concentration region is formed to enhance a breakdown voltage in a further effective mechanism in addition to the reason described above.

In the case in which a higher voltage which can be usually applied to the device is applied to the composite transistor gate terminal G, there is a fear of a drain-gate breakdown voltage and a drain-source breakdown voltage in relation to the voltage limiting transistor M1. For this reason, the drain end of the voltage limiting transistor M1 has the high breakdown voltage structure. Similarly, the drain end of the transistor M2 also has the high breakdown voltage structure. The reason is that there is a fear of the drain-gate breakdown voltage and the drain-source breakdown voltage in the same manner as in the voltage limiting transistor M1 also in the case in which a higher voltage than a voltage which can be usually applied to the device is applied to a composite transistor drain terminal D.

Figure 3:
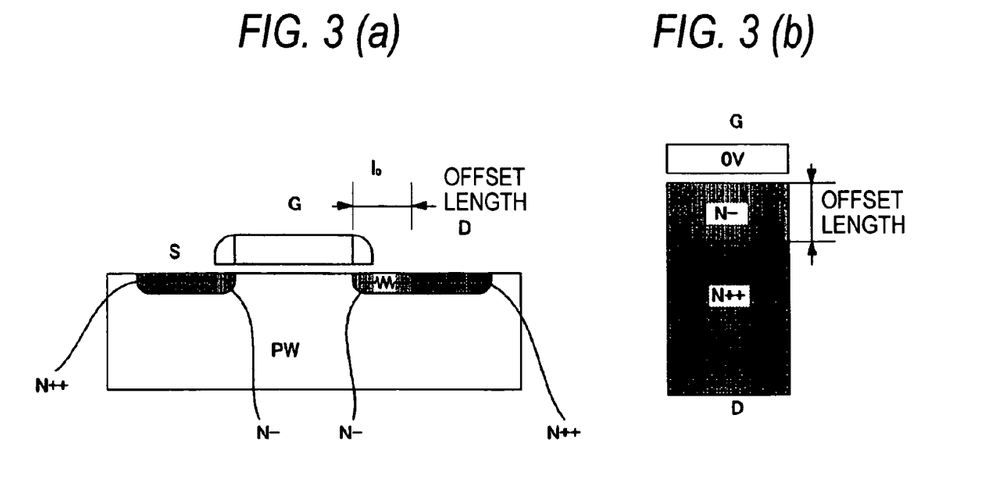
FIG. 3 is a view showing an Nch composite transistor according to the first embodiment of the invention, (a) being an explanatory view showing the high breakdown voltage structure of a drain and (b) being a partial explanatory view showing an Nch composite transistor drain.

Description will be given to the transistor having the high breakdown voltage structure on the drain end. FIG. 3 shows the sectional structure of a transistor having a high breakdown voltage structure on the drain end of the source and drain of an LDD structure transistor which is formed by adding an offset using a mask for the drain end in an impurity implantation. A low concentration diffusion and implantation region N− to be a low concentration region on the drain side is provided corresponding to lo offset lengths and a high concentration diffusion and implantation region N+ is provided therebeyond.

The application of a voltage for defining a drain breakdown voltage will be considered. It is assumed that 0V is applied to a source S, 0V is applied to a gate G and 10V is applied to a drain D, for example. In a transistor setting approximately 1.8V in accordance with the 0.18 μm process rule to be a standard voltage, for example, a thin gate oxide film having a thickness of approximately 4 nm is used. In consideration of an electric field on the transistor drain end, the gate G is set to be 0 V and a diffusion region is depleted from the low concentration diffusion and implantation region on the drain end provided under the gate to the high concentration implantation region through the gate oxide film so that a drain node is set to have a high voltage of 10 V.

To be exact, the way of depletion is to be simulated by means of a two-dimensional device simulator for explanation of the electric field of the oxide film and the depletion of the implantation region on the drain end. As shown in FIG. 3(b), the electric field of the oxide film and a depletion distance are calculated simply and schematically. For the simplification, a gate material is used and a gate oxide film, a low concentration implantation region having an Offset length and a high concentration implantation region are provided in a vertical direction.

Figure 4:
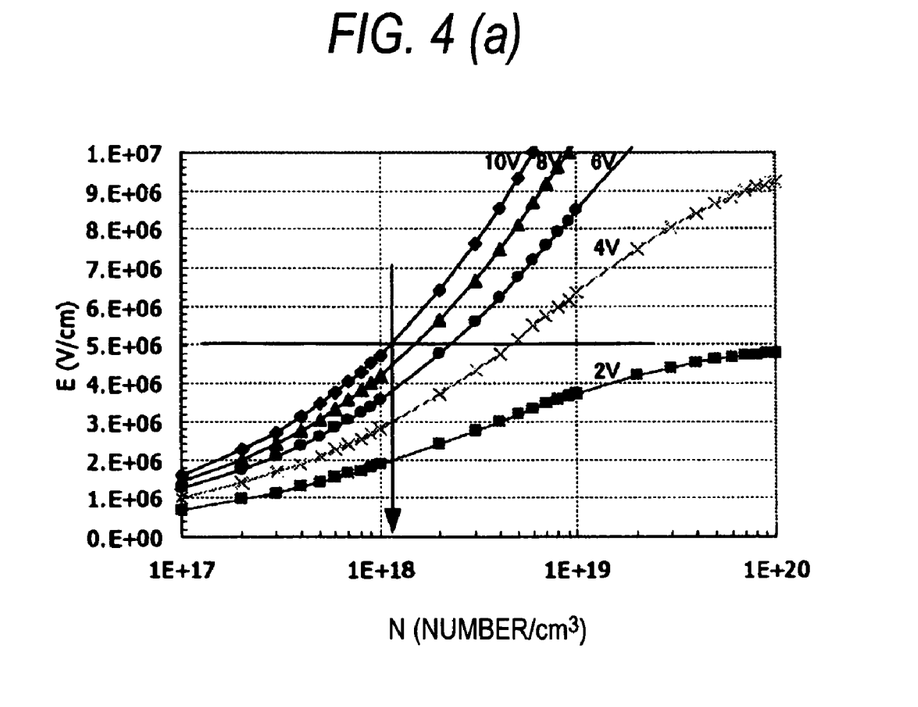
FIG. 4(a) is a chart showing a relationship between the concentration of a low concentration region and the electric field of a gate oxide film in the composite transistor according to the first embodiment of the invention and FIG. 4(b) is a chart showing a relationship between the concentration of the low concentration region and the width of a depletion layer.

FIG. 4(a) shows a relationship between the concentration of the low concentration implantation region and the electric field of the oxide film (the oxide film is set to have a thickness of 4 nm) by taking a drain voltage as a parameter in the case in which the simplification is carried out.

Moreover, FIG. 4(b) shows a relationship between the concentration of the low concentration implantation region and the width of a depletion layer (it is assumed that the offset length of a low concentration implantation region distance is sufficiently great) by taking a drain voltage as a parameter.

In the 0.18 μm process rule, the low concentration diffusion and implantation region of a transistor with an LDD structure has such an impurity concentration as not to deteriorate the driving capability of the transistor as much as possible, and the sustain voltage of a drain is sufficiently held within a normal voltage working range and a reliability lifetime is set to fully exceed 10 years. In general, setting is carried out to obtain a concentration of approximately $1E19\ cm^{-3}$.

On the other hand, referring to the lifetime of the oxide film, the electric field of the oxide film is set to be approximately $5E6$ V/cm or less and a design is carried out to have a lifetime of 10 years or more.

In consideration of the foregoing, for example, approximately 3V can be applied in a graph when the concentration of the low concentration implantation region is approximately $1E19\ cm^{-3}$, and the depletion of the drain end progresses when the concentration is reduced to approximately $1E18\ cm^{-3}$. A potential under the gate is reduced by the depletion and the electric field of the gate oxide film is $5E6$ V/cm or less even if 10V is applied to the drain.

At this time, the depletion layer has a width of approximately 0.1 µm.

A sidewall length in the 0.18 µm process generation is approximately 0.1 µm, and the concentration of the low concentration implantation region is approximately 1E18 cm$^{-3}$ for the application of a drain voltage of approximately 10V and the width of the depletion layer can be maintained with only an offset in a sidewall. However, a state in which there is no margin is brought. In order to maintain the margin, the concentration of the low concentration implantation region is further reduced. In order to maintain the width of the depletion layer to be increased correspondingly, moreover, the offset length is to be set in such a manner that an end to be implanted greatly by a mask is to be kept away from a gate and drain end (mask offset).

The description will be summarized. When a voltage is not very high, generally, it is also possible to substitute a low voltage implantation region depending on an LDD implantation concentration to be used for enhancing a reliability. In order to further raise the voltage, first of all, it is necessary to set a concentration which is equal to or lower than an LDD implantation concentration used generally. For this reason, another mask is added and a low concentration implantation is carried out under a sidewall in the same portion.

Referring to the mask for the normal LDD implantation, moreover, the portion is shielded in such a manner that the LDD implantation is not carried out. In the case in which the LDD implantation concentration is different from the concentration of the low concentration region, therefore, it is necessary to use masks for separately setting different concentrations in addition to the mask for an offset. Also in this case, however, a change in a gate oxide film forming step which influences all transistors is not carried out but an implanting step is simply changed, and a change in a process is limited very greatly.

Referring to a method of forming the low concentration implantation region, the implantation concentration of the low concentration implantation region is set to have a certain value or less by using any of a sidewall and a mask offset, and the length of a depletion layer corresponding to a voltage to be applied to a drain is maintained at a distance from the gate and drain end to the end of a high concentration diffusion and implantation region. Consequently, the electric field of a gate oxide film in a drain breakdown voltage state is relieved and is equal to or less than an electric field (5E6 V/cm) in a normal operation state.

Even if a voltage which is equal to or higher than a normal applied voltage is applied to the drain having the high breakdown voltage structure, thus, it is possible to maintain the breakdown voltage of the gate oxide film without changing the thickness of the gate oxide film.

Referring to the offset, moreover, the description has been given to the method of keeping the high concentration implantation region away from the gate and drain end. It is apparent from the argument about the depletion that a metallized region is to be offset in the case in which the metallization of salicide or silicide is to be carried out for an implantation region, for example. When the surface of the diffusion region is metallized, the depletion of the diffusion region to relieve the electric field of the gate oxide film is not caused but a gate breakdown is generated.

The description has been given to the case in which the reliability is obtained in a state in which a current does not flow between a source and a drain, that is, a static state. In the case in which the current flows between the source and the drain, a low concentration region forming the high breakdown voltage structure of the drain relieves an electric field caused by the depletion of the drain end and becomes a resistor on the drain side, and thus serves as a current limiting resistor between the source and the drain. Therefore, the generation of a hot electron on the drain end can be suppressed in an Nch transistor and a deterioration in the reliability can be suppressed. By a reduction in the impurity concentration, it is possible to further enhance the degree of the suppression.

The above argument applies to the two transistors of the composite transistor 1, the gate voltage limiting transistor M1, and the drain, the drain-gate and the drain-source of the main transistor M2 in the same manner. A breakdown voltage remains between the drain and a substrate.

Referring to the breakdown voltage between the drain and the substrate, it is preferable to take a diffusion breakdown voltage into consideration. As will be described below, it is preferable to make an investigation for each region. Referring to a place coming in contact with a gate end, first of all, a low concentration region for a high breakdown voltage structure is provided. Therefore, the breakdown voltage is enhanced. A well implantation or a channel implantation is carried out, over the bottom face of the high concentration implantation and diffusion region, and is thin in order of approximately 17th power or less. Therefore, a breakdown voltage of approximately 10 V is maintained. Referring to an isolation side, moreover, the breakdown voltage can be particularly prevented from being dropped in that portion in an STI isolation. Accordingly, an increase in the breakdown voltage can be implemented.

The composite transistor 1 constituted by the Nch transistor has been described above. Referring to the composite transistor 2 constituted by the Pch transistor, similarly, it is possible to cause the Nch and Pch composite transistors constituted by ordinary transistors to use a high voltage with a reliability maintained.

In the semiconductor integrated circuit device described above, the formation of the low concentration region has been described by using the drawing showing the case in which the ion implantation is carried out at a low acceleration and low doze. The impurity concentration of the low concentration region for relieving the electric field of the gate oxide film should be set to be equal to or lower than approximately 1E18 cm$^{-3}$ in order to raise a working voltage to approximately 10V in the conventional example as shown in FIG. 4(a), which is too high in an N-impurity implantation to be used in an ordinary LDD. For this reason, a different implanting step from the LDD implantation is required.

Figure 5:
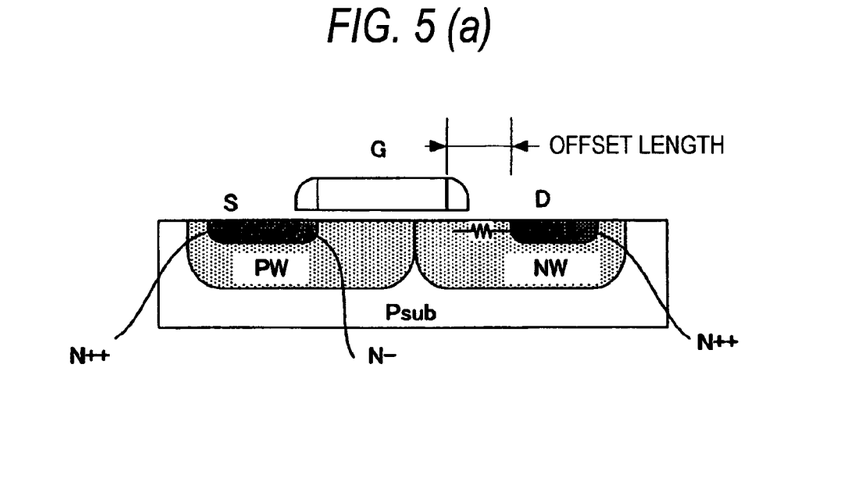
FIG. 5 is an explanatory view showing the high breakdown voltage structure of the drain in the composite transistor according to the embodiment, (a) showing Nch and (b) showing Pch.

In a CMOS process, the well implantation is carried out and the impurity concentration of the well implantation is in order of 17th power. FIG. 5(a) shows the case in which a well structure is used for the high breakdown voltage structure of the Nch composite transistor. From a left side, the source S is formed in a P well PW by a high concentration impurity implantation, and a low concentration region is continuously formed with the same structure as an ordinary transistor and a gate is extended to a drain side.

With this structure, the P well PW ends in the middle of the gate G, which gives a gate length. An N well NW is further formed as a low concentration region on the drain side at a right side and a high concentration implantation and diffusion region N++ is formed apart from the gate end by an offset distance. A distance for defining the gate length, that is, a distance for defining the offset length described above is different from that of the transistor having the structure described above. Also in this case, however, the same argument is possible for a drain-gate breakdown voltage (the breakdown voltage of an oxide film) and a drain-source breakdown voltage. Even if a transistor having the drain with the high breakdown voltage structure is applied to the composite transistor according to the embodiment, the same advantages can be obtained.

In this case, moreover, another implanting step does not need to be introduced and manufacture can be carried out more inexpensively. FIG. 5(b) shows a transistor in which the drain portion of a Pch transistor has the high breakdown voltage structure over a P substrate in the same manner as in FIG. 5(a). In contrast with the case of the Nch transistor, there is employed a structure in which the implantation species of the Pch and Nch are replaced with each other and a deep N well implantation DeepNW is provided to wrap the P well PW and the N well NW. The reason is that the deep N well implantation DeepNW for an isolation from a substrate PSUB is required in such a manner that a voltage can be independently applied to the drain D of the Pch transistor. While the description has been given by taking the P substrate as an example, the deep N well implantation DeepNW in the Pch transistor is not required for an N substrate. To the contrary, it is possible to fabricate a high breakdown voltage structure in the same manner by only a change into a P well implantation DeepPW in the Nch transistor.

Returning to FIG. 1, first of all, description will be given to the inverter logic on a minimum unit which is constituted by the Nch and Pch composite transistors 1 and 2.

The Nch composite transistor 1 is provided on the ground potential GND side and the first shielding voltage VSHLD1 is input to the gate voltage limiting transistor gate, and the Pch composite transistor 2 is provided on the high voltage power supply Vpp side and the second shielding voltage VSHLD2 is input to the gate voltage limiting transistor gate, and each of the composite transistors 1 and 2 has the gate connected to the input terminal IN and the drain connected to the output terminal OUT.

The voltage of the high voltage power supply Vpp is set to be 10V, the amplitude of the input terminal IN is set to be 0V to 10V, the amplitude of the output terminal OUT is set to be 0V to 10V, the first shielding voltage VSHLD1 is set to be 3.6V, and the second shielding voltage VSHLD2 is set to be 6.4V. Moreover, each of the Nch and Pch transistors has a normal working voltage set to be 3.6V or less and a threshold voltage of Vtn=0.6V and Vtp=−0.6V. In the high breakdown voltage structure of each of the drain ends, furthermore, it is assumed that a low concentration implantation and diffusion region and an offset length are set corresponding to a maximum voltage to be applied.

Assuming that 10V is applied to the input terminal IN, 10V is applied to the drain of the gate voltage limiting transistor M1. The drain is provided with the high breakdown voltage structure. For this reason, there is brought a state in which a high voltage is applied to a drain to set a drain of 10V, a gate of 3.6V and a source of 3V (3.6V of the shielding voltage VSHLD1-Nch transistor threshold Vtn=0.6V). Because of the high breakdown voltage structure of the drain, the transistor M1 is operated without troubles as in the above argument, and furthermore, 3V which is equal to or lower than the normal working voltage is applied as the gate voltage of the main transistor M2 in the Nch composite transistor 1 to bring an ON state so that the output terminal OUT is driven to 0V.

On the other hand, referring to the Pch composite transistor 2, a voltage of 10V applied to the gate terminal of the composite transistor 2 is transmitted as an exact voltage to the gate of the main transistor M4 in the second composite transistor 2 through the gate voltage limiting transistor of the second composite transistor 2 to which 6.4V of the second shielding voltage VSHLD2 is applied. Since the source voltage of the main transistor M4 in the second composite transistor 2 is 10V, an OFF state is brought and the drain voltage is 0V. Since the transistor M4 has a drain with the high breakdown voltage structure, it can be operated normally for the application of 0V.

To the contrary, assuming that 0V is applied to the input terminal IN, 0V of the gate of the composite transistor 1 is applied as an exact voltage to the gate of the main transistor M2 and 10V is applied to the drain. However, the drain has the high breakdown voltage structure so that breakdown voltages between the drain and the source and between the drain and the gate are maintained. On the other hand, the shielding voltage VSHLD2 of 6.4V is applied to the gate of the gate voltage limiting transistor M3 in the Pch composite transistor 2 so that the drain is set to be 0V, the gate is set to be 6.4V and the source is set to be 7V (6.4V of the shielding voltage VSHLD2-Nch transistor threshold Vtp=−0.6V). There is brought a state in which a high voltage is applied to the drain based on a Pch source. Because of the high breakdown voltage structure of the drain, however, the transistor M3 is operated without troubles as in the above argument. Moreover, −3V which is equal to or lower than a normal working voltage is applied as the gate voltage of the main transistor M4 in the Pch composite transistor 2 based on the source so that an ON state is brought and the output terminal OUT is driven to 10V.

Thus, there is provided the gate voltage limiting transistor in which a proper shielding voltage is applied to the gate, and the composite transistors using transistors applying the high breakdown voltage structure to the drains of the transistors to be constituted are combined. Consequently, the conventional voltage limiting transistor on the drain side is not required and the size of a layout can be reduced, and furthermore, the limiting voltage can be higher than a double of a normal working voltage and can be raised to a voltage with an increase in a breakdown voltage.

While the first shielding voltage VSHLD1 and the second shielding voltage VSHLD2 are set to be different from each other in the embodiment, each of the first and second shielding voltages may be set to be a half of a maximum working voltage thereof if a voltage range to be used is a double of a voltage range to be used usually or less, for example. Thus, a shielding voltage setting circuit can be simplified.

In this case, moreover, the gate voltage (shielding voltage) of the gate voltage limiting transistor is set to be a half of the working voltage. For this reason, the drain side does not need to take the high breakdown voltage structure and a normal transistor can be used. The numeric value used in the above description is an approximate value and does not strictly define the invention. The following description of embodiments will be given in the same manner.

Second Embodiment

Next, a second embodiment of the invention will be described.

Figure 6:
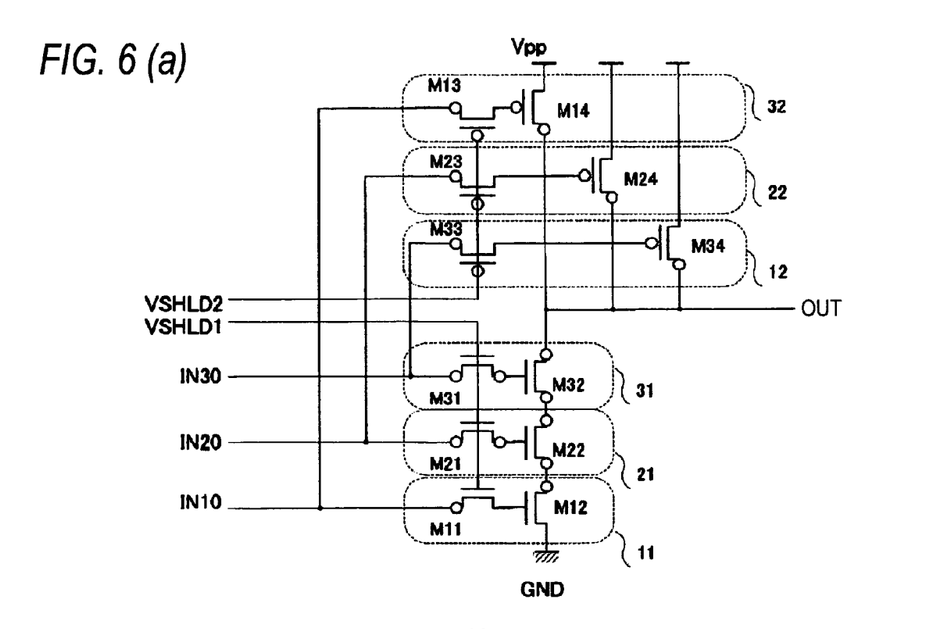
FIG. 6 is an explanatory diagram showing 3NAND obtained by the combination of the composite transistors according to the embodiment.

FIG. 6(a) shows a 3NAND constituted by combining Pch and Nch composite transistors. Nch composite transistor 11, 21 and 31 to which a first shielding voltage VSHLD1 is input are connected in series from a ground potential GND side and are connected to an output terminal OUT respectively, while Pch composite transistors 12, 22 and 32 to which a second shielding voltage VSHLD2 is input are connected in parallel from a high voltage power supply Vpp side and are connected to the output terminal OUT respectively. Moreover, three input terminals IN10, IN20 and IN30 are input to main transistors which are NAND connected through the gate voltage limiting transistors of the composite transistors. With disregard of gate voltage limiting transistors M11, M21, M31, M12, M22 and M32, an ordinary 3NAND is provided and it is easily apparent that the operation of the 3NAND is logically carried out. A slight difference is made between the portions of high breakdown voltage structures in the composite transistor 11 and the composite transistors 21 and 31. This will be described with reference to FIG. 6(b) in which a voltage is written.

In FIG. 6(b), the composite transistors 21 and 31 have a difference depending on whether or not the high breakdown voltage structure is provided on the source sides of the composite transistor 1 and the gate voltage limiting transistors M21 and M31 and main transistors M22 and M32 which have been described above. It is assumed that 10V is applied to the input terminals IN10, IN20 and IN30, and then, the input IN20 is dropped from 10V to 0V. At this time, the gate voltage of the transistor M22 is 3V at first and is then dropped to 0V so that one of the Nch transistors connected in series is cut off. Consequently, the output terminal OUT makes a transition from 0V to 10V.

At this time, the channel potential of the upper transistor M32 (the output terminal side) which has just been cut off is raised from 0V. Moreover, the gate voltage limiting transistor M31 is connected to the gate of the transistor M32, and 3.6V is applied to a gate and 10V is applied to a drain. Therefore, self-boot is applied.

There is a possibility that the gate voltage of the transistor M32 to which 3V is applied at first might be raised corresponding to a rise in a maximum channel potential depending on the layout of a portion to which the self-boot is applied and 13V might be applied. When the voltage of the node is raised to 13V, a breakdown voltage between a source and a gate in the gate voltage limiting transistor M31 cannot be held with an ordinary structure. For this reason, the high breakdown voltage structure is also required on the source side of the gate voltage limiting transistor M31.

When the gate voltage of the transistor M32 receives the self-boot and is thus raised, moreover, the transistor M32 can also cause a voltage of 10V on the output terminal OUT side to pass therethrough. For this reason, 10V of the drain voltage of the transistor M22 is applied in some cases. Therefore, the voltage is not limited irrespective of the Nch transistor M32 in one stage on a high voltage side. Thus, the high voltage structure is also required for the drain of the lower transistor M22 by one stage (the GND side).

The same argument can also apply to the gate voltage limiting transistor M21. Referring to the gate voltage limiting transistor M11 which is the closest to the ground GND side, an electric potential on a source side is fixed to the ground potential GND so that the source potential is not raised and a channel potential is rarely raised. Accordingly, the self-boot is rarely applied. For this reason, it is rarely necessary to cause the source side of the gate voltage limiting transistor M11 to have the high breakdown voltage structure.

In the case in which the self-boot of the gates of the transistors M32 and M22 rarely produces advantages based on a relationship between a layout and a floating capacity, it is not necessary to employ the high breakdown voltage structures on the source sides of the gate voltage limiting transistors M31 and M21 and the high breakdown voltage structures on the drain sides of the transistors M22 and M12.

In the case in which the input terminal IN20 is changed from 10V to 0V and the input terminal IN30 is then changed from 10V to 0V, the gate voltage is dropped to 0V with the source side maintained to be 10V if the self-boot is applied to the transistor M32. In this case, a breakdown voltage between the source and the gate in the transistor M32 cannot be maintained. For this reason, the high breakdown voltage structure is also applied to this portion, that is, the source side of the transistor M32. Referring to the transistor M22, the same application is carried out. As a matter of course, in the case in which there is employed a layout in which the self-boot is not applied very greatly, the high breakdown voltage structure of the source portion is not required in the same manner as in the above argument.

Third Embodiment

Figure 7A:
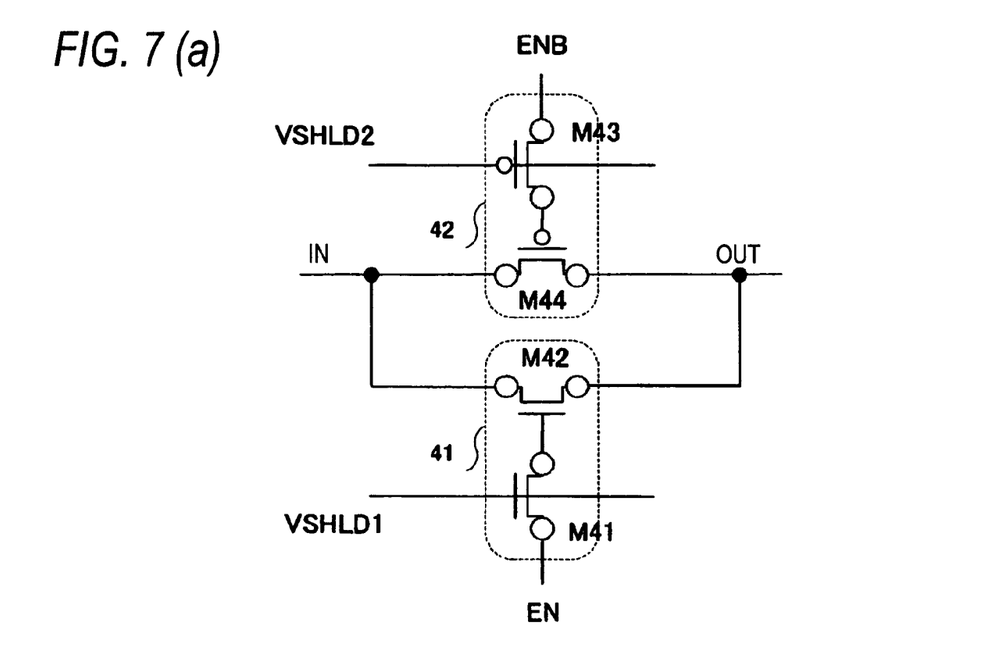
FIG. 7 is a diagram showing a complementary transfer gate obtained by the combination of the composite type transistors according to the embodiment.
Figure 7B:
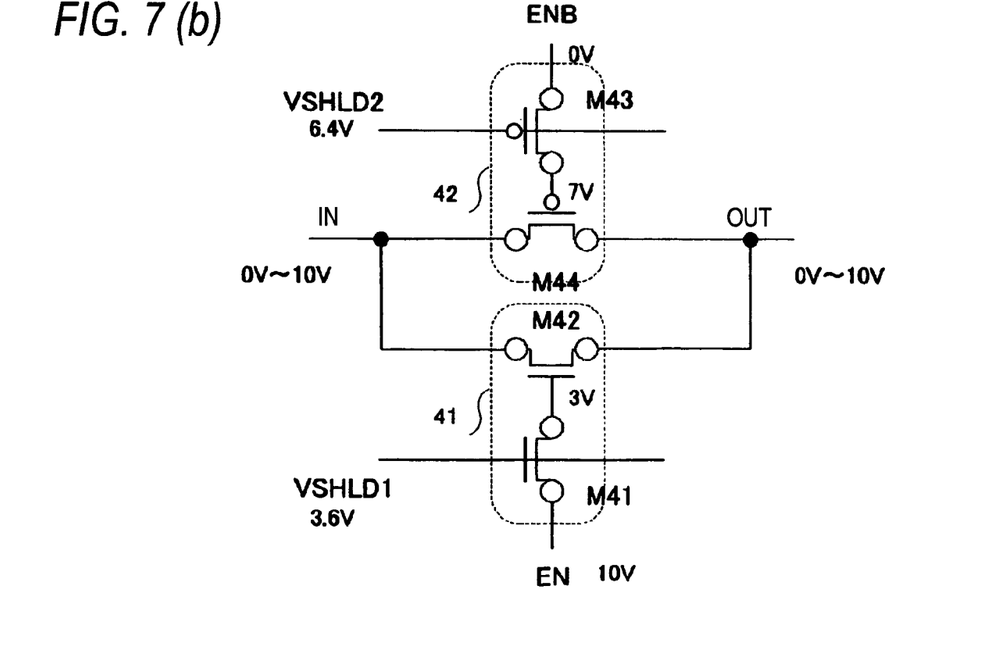

Next, a third embodiment of the invention will be described. In the embodiment, description will be given to a complementary type transfer gate constituted by combining Pch and Nch composite transistors as shown in FIG. 7(a). A first shielding voltage VSHLD1 and a second shielding voltage VSHLD2 are applied to composite type transistors 41 and 42 in which both a gate voltage limiting transistor and a main transistor have a high breakdown voltage structure on sources and drains, and the gate voltages of main transistors M42 and M44 are limited. Moreover, it is assumed that the source and the drain to be connected to an input terminal IN and an output terminal OUT have the high breakdown voltage structure because a high voltage might be applied thereto. Moreover, the source of a gate voltage limiting transistor on a side to be connected to the gate of the main transistor is also caused to have the high breakdown voltage structure. FIG. 7(b) shows the relationship of a voltage in which the complementary type transfer gate is set in an ON state.

It is apparent that the gate voltage is limited by the gate voltage limiting transistor and the high breakdown voltage structure is applied to a node to which a high voltage is applied. In the transfer gate, terminals are not determined to be an input and an output. For this reason, there is a possibility that a high voltage might be applied to both the source and the drain in the main transistor. Therefore, the high breakdown voltage structure is employed. In some cases, moreover, a comparatively great capacitive load is applied to the output terminal OUT of the complementary type transfer gate. As described in the embodiment for the 3NAND, the self-boot is greatly applied to the gates of the main transistors M42 and M44 in some cases. For this reason, the high breakdown voltage structure is also employed on the source sides of gate voltage limiting transistors M41 and M43.

As described above, the gate of the main transistor is connected through the gate voltage limiting transistor gated with a shielding voltage, and the inverter, the 3NAND and the complementary type transfer gate which are obtained by combining the composite transistors applying the high breakdown voltage structures to the source and the drain to which a high voltage is applied are operated while maintaining a reliability beyond at least a double of a voltage range to be used usually. By the description of the operation of the logic circuit, it is possible to easily analogize that a logic circuit NOR, a Clocked inverter and other general logic circuits which are not shown but used generally can also be constituted to be operated while maintaining a reliability beyond at least a double of a voltage range to be used usually.

In a logic circuit and a driver according to the invention, it is possible to increase a working power supply range without a considerable change in a process, for example, the introduction of transistors having the different thicknesses of oxide films. Therefore, they are useful for an interface from an inside of a chip to the inside thereof or from the inside of the chip to an outside thereof, for example, in the case in which a high voltage is handled partially under device restrictions or interface restrictions. For example, the invention can also be applied to uses, that is, the driver circuit of a nonvolatile memory (a CMOS flash) manufactured in a pure process or a 5V-IO pad in a low voltage dedicated process.

What is claimed is:

1. A semiconductor integrated circuit device having a CMOS integrated circuit capable of carrying out an operation at a comparatively high supply voltage, comprising:

a first MOS type transistor having a drain profile to come in contact with a gate through a low concentration region having an impurity concentration which is equal to or lower than a predetermined concentration at a drain end; and a second MOS type transistor which has the same polarity as the first MOS type transistor and which is connected to a gate of the first MOS type transistor, wherein a gate voltage is applied to the gate of the first MOS type transistor through the second MOS type transistor to which a predetermined potential (a shielding voltage) is applied, the first and second MOS type transistors are N type and the source of the first MOS type transistor is connected to a first power supply;

said semiconductor integrated circuit device further comprising:

a composite type MOS semiconductor unit which has a drain profile to come in contact with the gate through a low concentration region having a predetermined length or more and predetermined concentration or less at a drain end of a third MOS type transistor and in which a common gate voltage to the first MOS type transistor is applied to a gate of the third MOS type transistor through a fourth MOS type transistor which has the same polarity as the third MOS type transistor to which a second predetermined potential (a second shielding voltage) is applied, the third and fourth MOS type transistors having a P type and a source of the third MOS type transistor being connected to a second power supply, said semiconductor integrated circuit device further comprising:

a signal output end, the drain end of the first MOS type transistor and the drain end of the third MOS type transistor are directly connected to the signal output end.

2. The semiconductor integrated circuit device according to claim 1, wherein at least one of the second MOS type transistor and the fourth MOS type transistor has a drain profile to come in contact with a gate through a low concentration region having an impurity concentration which is equal to or lower than a predetermined concentration at a drain end.

3. The semiconductor integrated circuit device according to claim 1, wherein at least one of the second MOS type transistor and the fourth MOS type transistor has an impurity profile to come in contact with a gate through a low concentration region having an impurity concentration which is equal to or lower than a predetermined concentration at both a drain end (a signal input end) and a source end.

4. The semiconductor integrated circuit device according to claim 1, wherein at least one of the first MOS type transistor and the fourth MOS type transistor has a drain profile to come in contact with a gate through a low concentration region having an impurity concentration which is equal to or lower than a predetermined concentration at both a drain end and a source end.

5. The semiconductor integrated circuit device according to claim 1, wherein the predetermined concentration is equal to or lower than 5E18 cm$^{-3}$.

6. The semiconductor integrated circuit device according to claim 5, wherein the low concentration region has a length of 0.05 μm or more.

7. The semiconductor integrated circuit device according to claim 1, wherein the low concentration region is formed to maintain a predetermined dimension by using a photomask formed to cause a high concentration region acting as the drain to have an offset with respect to the gate, and the high concentration region is formed with an offset with respect to the gate.

8. The semiconductor integrated circuit device according to claim 1, wherein the low concentration region has a region formed to maintain a predetermined dimension by using a sidewall spacer and in which an implantation is carried out with an offset with respect to the gate.

9. The semiconductor integrated circuit device according to claim 1, wherein the low concentration region is a second well having an opposite conductivity type to that of a first well having a certain conductivity type which constitutes a channel, said low concentration region being adjacent said first well.

10. The semiconductor integrated circuit device according to claim 9, wherein the first well and the second well are formed in a deep well.

11. A semiconductor integrated circuit device having a CMOS integrated circuit capable of carrying out an operation at a comparatively high supply voltage, comprising:

a first MOS type transistor having a drain profile to come in contact with a gate through a low concentration region having an impurity concentration which is equal to or lower than a predetermined concentration at a drain end; and a second MOS type transistor which has the same polarity as the first MOS type transistor and which is connected to a gate of the first MOS type transistor, wherein a gate voltage is applied to the gate of the first MOS type transistor through the second MOS type transistor to which a predetermined potential (a shielding voltage) is applied, the first and second MOS type transistors are N type and the source of the first MOS type transistor is connected to a first power supply;

said semiconductor integrated circuit device further comprising:

a composite type MOS semiconductor unit which has a drain profile to come in contact with the gate through a low concentration region having a predetermined length or more and a predetermined concentration or less at a drain end of a third MOS type transistor and in which a common gate voltage to the first MOS type transistor is applied to a gate of the third MOS type transistor through a fourth MOS type transistor which has the same polarity as the third MOS type transistor to which a second predetermined potential (a second shielding voltage) is applied, and which has a drain profile to come in contact with the gate through a low concentration region having a predetermined length or more and a predetermined concentration or less at a drain end (a signal input end) of the fourth MOS type transistor, the third and fourth MOS type transistors having a P type and a source of the third MOS type transistor being connected to a second power supply, said semiconductor integrated circuit device further comprising:

a signal output terminal, the drain end of the first MOS type transistor and the drain end of the third MOS type transistor are directly connected to the signal output terminal.

12. The semiconductor integrated circuit device according to claim 1, wherein a plurality of composite type MOS semiconductor units of Nch is connected in series from a first power supply side, an output terminal is connected and a first shielding voltage is input in common, and the composite type MOS semiconductor unit of Pch is connected in parallel with a second power supply from the output terminal, a second shielding voltage is input in common, and an input of the composite type MOS semiconductor unit of each of the Pch and the Nch has an input terminal in each of the Pch and the Nch making a pair.

13. The semiconductor integrated circuit device according to claim 1, wherein a plurality of composite type MOS semiconductor units of Pch is connected in series from a second power supply side, an output terminal is connected and a second shielding voltage is input in common, and the composite type MOS semiconductor unit of Nch is connected in parallel with a first power supply from the output terminal, a first shielding voltage is input in common, and an input of the composite type MOS semiconductor unit of each of the Pch and the Nch has an input terminal in each of the Pch and the Nch making a pair.

14. The semiconductor integrated circuit device according to claim 1, wherein each of the drain and the source of the first transistor of the composite type MOS semiconductor unit of Nch is connected to each of the drain and the source of the first transistor of the composite type MOS semiconductor unit of Pch, and a shielding voltage of the composite type MOS semiconductor unit of the Nch is a first shielding voltage and a shielding voltage of the composite type MOS semiconductor unit of the Pch is a second shielding voltage.

15. The semiconductor integrated circuit device according to claim 11, wherein the first predetermined potential (the first shielding voltage) is equal to the second predetermined potential (the second shielding voltage).

16. The semiconductor integrated circuit device according to claim 12, wherein the first predetermined potential (the first shielding voltage) is equal to the second predetermined potential (the second shielding voltage).

17. The semiconductor integrated circuit device according to claim 13, wherein the first predetermined potential (the first shielding voltage) is equal to the second predetermined potential (the second shielding voltage).

18. The semiconductor integrated circuit device according to claim 14, wherein the first predetermined potential (the first shielding voltage) is equal to the second predetermined potential (the second shielding voltage).

19. The semiconductor integrated circuit device according to claim 1, wherein the CMOS integrated circuit transistor structure includes both a transistor structure belonging to the composite type MOS semiconductor unit and a transistor structure which does not belong to the composite type MOS semiconductor unit.

\* \* \* \* \*